(12) United States Patent
Jindo et al.

(10) Patent No.: US 10,879,047 B2
(45) Date of Patent: Dec. 29, 2020

(54) PLASMA GENERATOR

(71) Applicant: FUJI CORPORATION, Chiryu (JP)

(72) Inventors: Takahiro Jindo, Anjo (JP); Toshiyuki Ikedo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 137 days.

(21) Appl. No.: 16/082,917

(22) PCT Filed: Mar. 14, 2016

(86) PCT No.: PCT/JP2016/057934
§ 371 (c)(1),
(2) Date: Sep. 6, 2018

(87) PCT Pub. No.: WO2017/158671
PCT Pub. Date: Sep. 21, 2017

(65) Prior Publication Data
US 2019/0131109 A1 May 2, 2019

(51) Int. Cl.
*H01J 37/32* (2006.01)
*H05H 1/48* (2006.01)

(52) U.S. Cl.
CPC .... *H01J 37/3244* (2013.01); *H01J 37/32055* (2013.01); *H01J 37/32458* (2013.01); *H01J 37/32532* (2013.01); *H05H 1/48* (2013.01)

(58) Field of Classification Search
CPC ............ H01J 37/3244; H01J 37/32055; H01J 37/32458; H01J 37/32532; H05H 1/48; H05H 1/34; H05H 2001/3478
See application file for complete search history.

(56) References Cited

U.S. PATENT DOCUMENTS

| 6,424,091 B1 * | 7/2002 | Sawada | H01J 37/32009 118/723 AN |
| 2013/0168361 A1 * | 7/2013 | Hori | H05H 1/48 219/69.11 |

FOREIGN PATENT DOCUMENTS

| JP | 3-290928 A | 12/1991 |
| JP | 2012-14927 A | 1/2012 |

OTHER PUBLICATIONS

International Search Report dated May 31, 2016, in PCT/JP2016/057934 filed Mar. 14, 2016.

* cited by examiner

*Primary Examiner* — Ram N Kackar
(74) *Attorney, Agent, or Firm* — Oblon, McClelland, Maier & Neustadt, L.L.P.

(57) ABSTRACT

In a plasma generator, a reaction chamber is divided into a pair of insertion portions, for inserting a pair of electrodes, and a connecting segment that connects the pair of insertion portions. The connecting segment is narrower than the pair of insertion portions. Since the connecting segment is narrower than the insertion portions, the volume of the connecting segment is small. Accordingly, the process gas having a small volume is converted into plasma over the entire region of the connecting segment and along the wall surfaces that are continuous from each insertion portion to the connecting segment, thereby enabling the process gas to be converted to plasma efficiently. Further, the junctures of each of the pair of insertion portions and the connecting segment are smooth surfaces. As a result, heat from discharging is dispersed over the entire smooth surface, thereby suppressing carbonization from discharging.

3 Claims, 12 Drawing Sheets

PLASMA GENERATOR

TECHNICAL FIELD

The present application relates to a plasma generator for converting a process gas into plasma inside a reaction chamber.

BACKGROUND ART

In the plasma generators as described, for example, in the following patent documents, a plurality of electrodes are disposed in a reaction chamber and voltage is applied between the plurality of electrodes to convert a process gas into plasma.

CITATION LIST

Patent Literature

PTL 1: Japanese Patent Application Laid-Open No. 2012-14927 Patent Document 2: Japanese Patent Application Laid-Open No. 3-290928

BRIEF SUMMARY

Technical Problem

When process gas is converted into plasma, it is necessary to apply a relatively high voltage, and since a discharge is generated by applying the voltage, the wall surface of the reaction chamber may become carbonized. Further, in order to efficiently generate plasma, it is necessary to adequately discharge the plasma inside the reaction chamber in which the process gas is supplied. In this way, there are various problems in plasma generators. By solving these various problems, the practicality of the plasma generators is improved. The present disclosure has been made in view of such circumstances, and an object of the present disclosure is to provide a highly practical plasma generator.

Solution to Problem

In order to solve the above-mentioned problems, the plasma generator according to the present application includes a first block having a reaction chamber, a pair of electrodes inserted into the reaction chamber for converting a process gas into plasma in the reaction chamber, and a nozzle for ejecting the gas converted to plasma in the reaction chamber toward a process target, wherein the reaction chamber is divided into a pair of first insertion portions, for inserting the pair of electrodes, and a first connecting segment narrower than the pair of first insertion portions, and junctures of each of the pair of first insertion portions with the first connecting segment are smooth surfaces.

Advantageous Effects

In the plasma generator described in the present application, the junctures of each of the pair of insertion portions and the connecting segment are smooth surfaces. As a result, heat from discharging is dispersed over the entire smooth surface, thereby suppressing carbonization from discharging.

DESCRIPTION OF EMBODIMENTS

Figure 1:
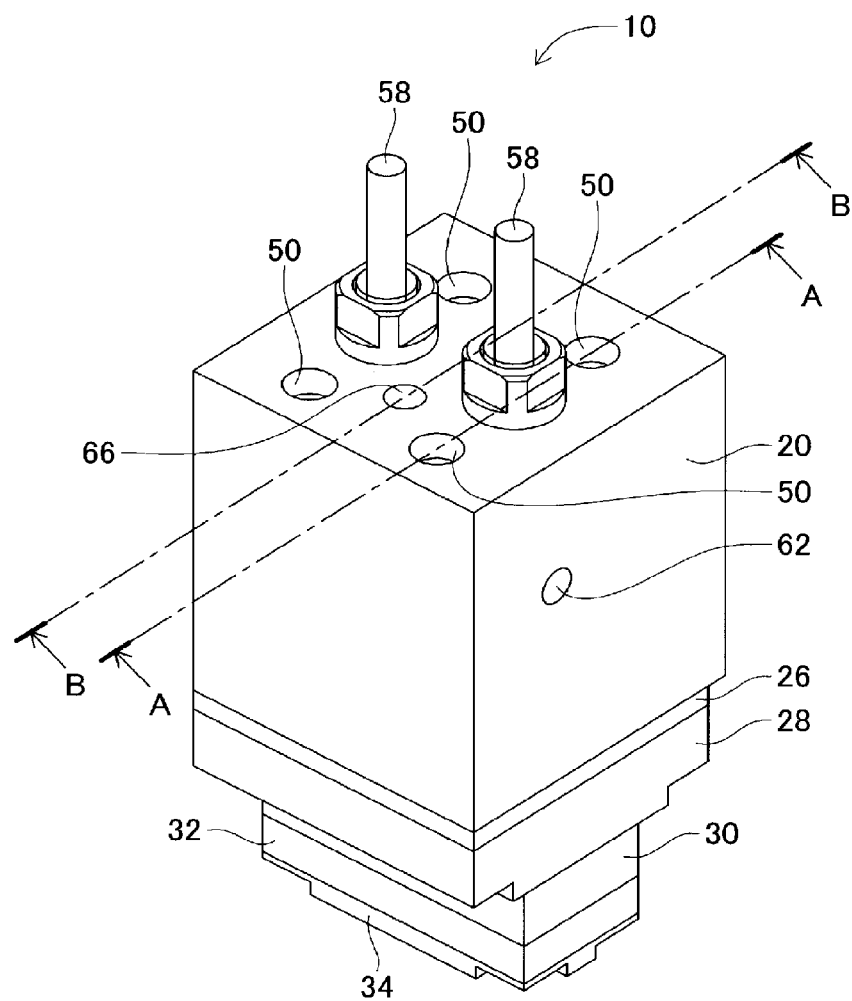
FIG. 1 is a perspective view showing an atmospheric pressure plasma generator.

Hereinafter, as a mode for carrying out the present disclosure, an embodiment of the present disclosure will be described in detail with reference to the drawings.

FIGS. 1 to 5 show an atmospheric pressure plasma generator 10 according to an embodiment of the present disclosure. The atmospheric pressure plasma generator 10 is an apparatus for generating plasma under atmospheric pressure. The atmospheric pressure plasma generator 10 includes a main body block 20, a pair of electrodes 22, a buffer member 26, a first connecting block 28, a reaction chamber block 30, a second connecting block 32, and a nozzle block 34.

Figure 2:
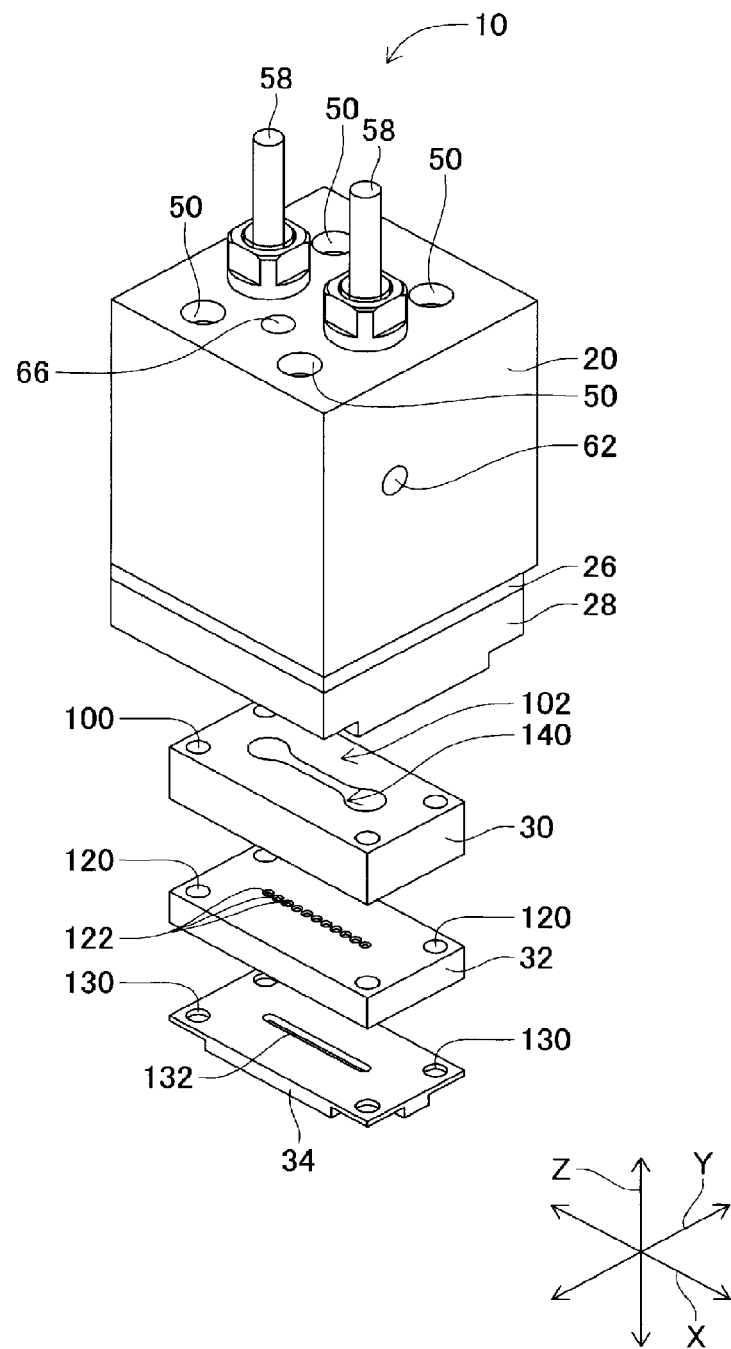
FIG. 2 is a perspective view showing the atmospheric pressure plasma generator in a disassembled state.
Figure 3:
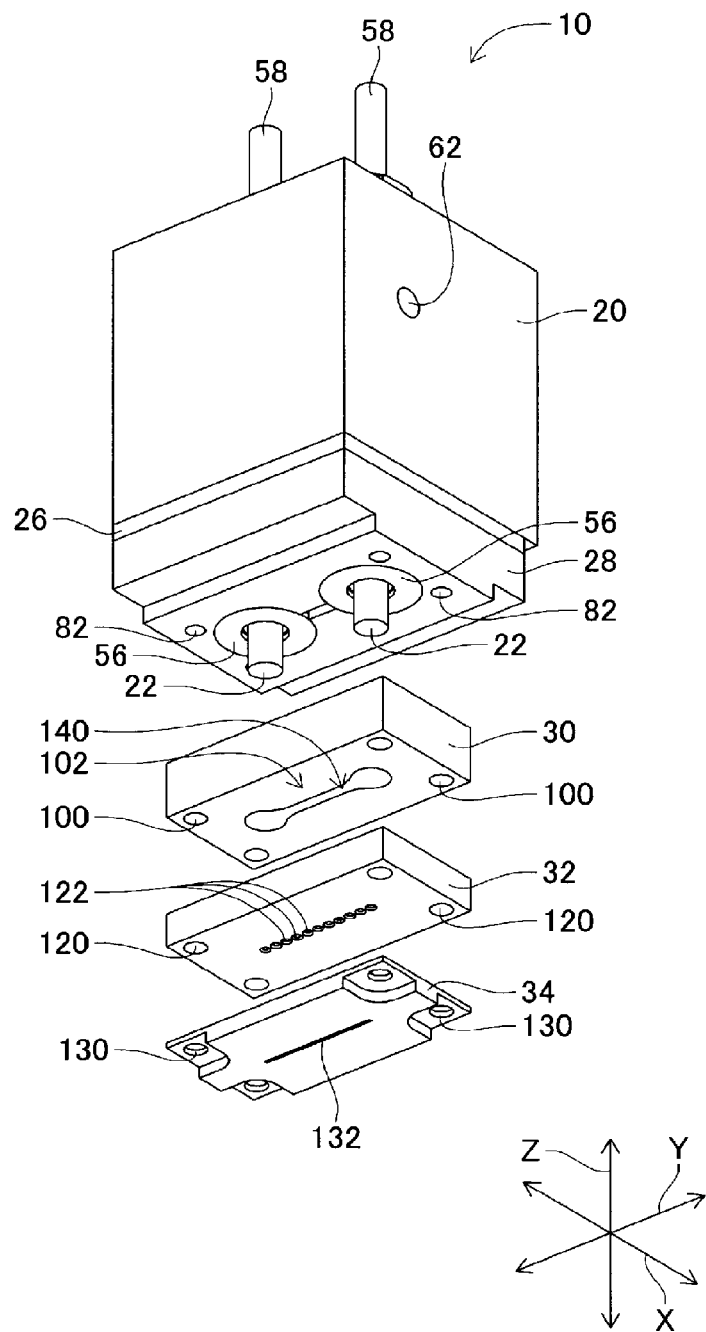
FIG. 3 is a perspective view showing the atmospheric pressure plasma generator in a disassembled state.
Figure 4:
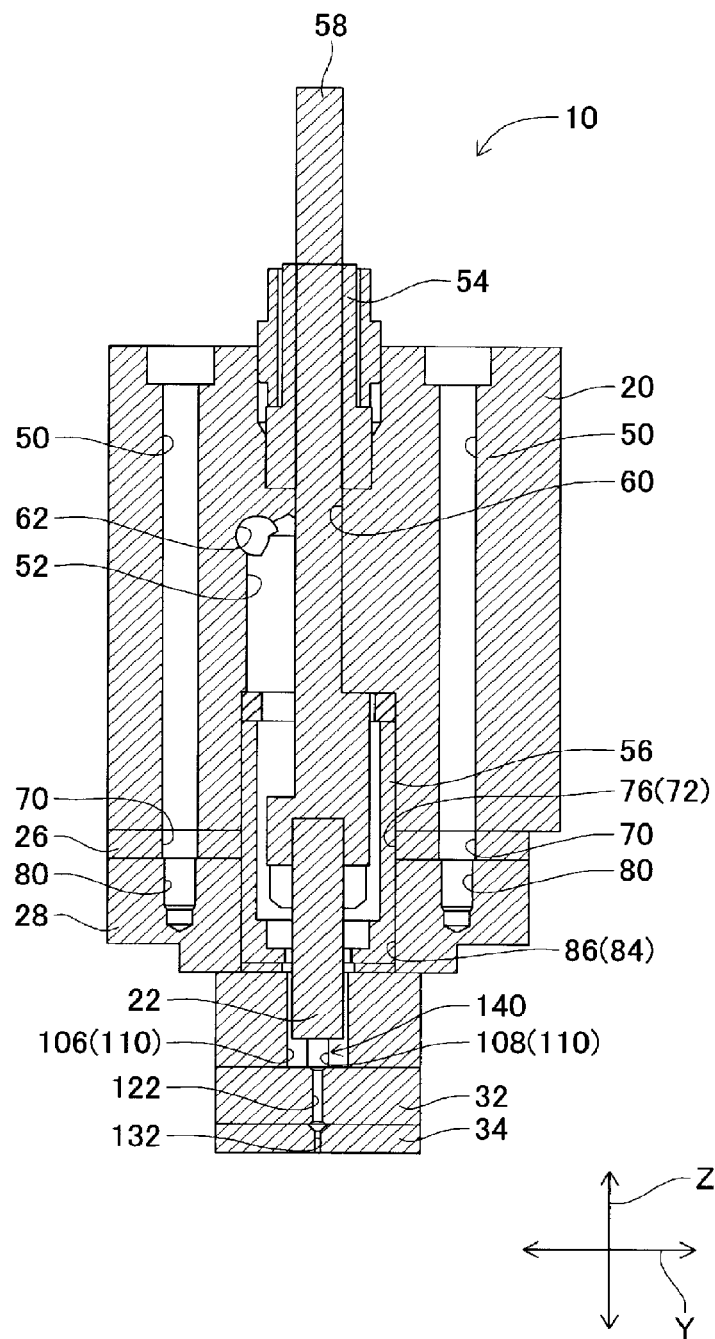
FIG. 4 is a cross-sectional view taken along line AA of FIG. 1.
Figure 5:
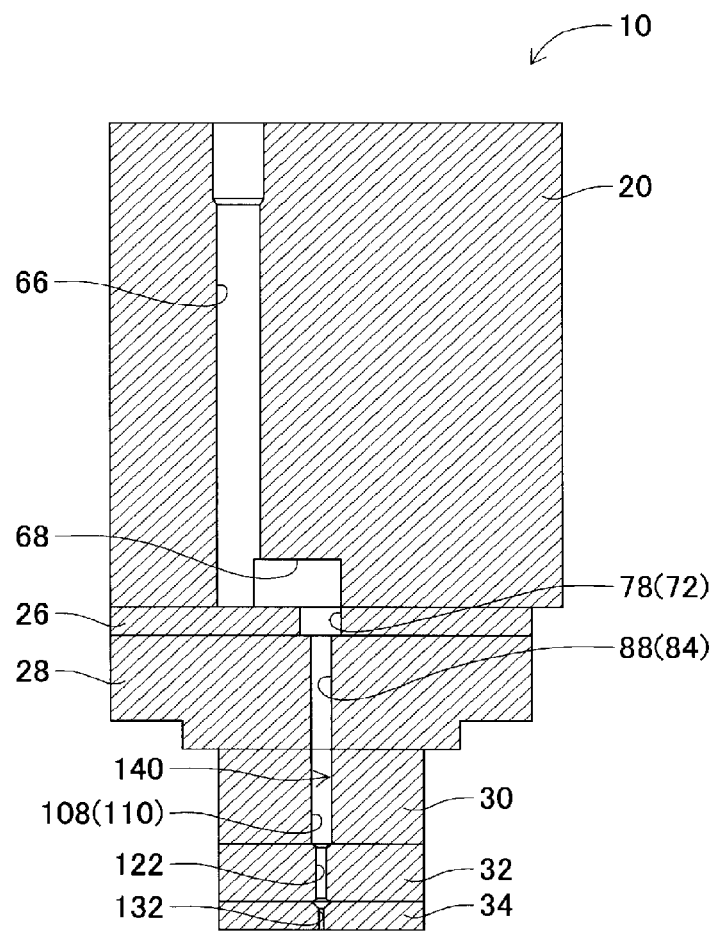
FIG. 5 is a cross-sectional view taken along line BB of FIG. 1.
Figure 5:
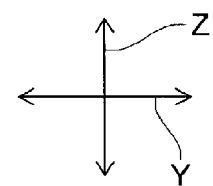

FIG. 1 is a perspective view showing the atmospheric pressure plasma generator 10 from above at an oblique angle. FIG. 2 is a perspective view showing the atmospheric pressure plasma generator 10 in a disassembled state from above at an oblique angle. FIG. 3 is a perspective view showing the atmospheric pressure plasma generator 10 in a disassembled state from below at an oblique angle. FIG. 4 is a cross-sectional view taken along line AA of FIG. 1. FIG. 5 is a cross-sectional view taken along line EB of FIG. 1. The width direction of the atmospheric pressure plasma generator 10 is referred to as the X direction, the depth direction of the atmospheric pressure plasma generator 10 is referred to as the Y direction, and the direction orthogonal to the X direction and the Y direction, that is, the vertical direction, is referred to as the Z direction.

The main body block 20 has a substantially rectangular parallelepiped shape and is made of a heat-resistant resin. Four bolt holes 50 penetrate the main body block 20 in the vertical direction, and apertures of the four bolt holes 50 are provided approximately at the four corners of the upper and lower surfaces of the main body block 20. Further, two insertion holes 52 penetrate the main body block 20 in the vertical direction and are positioned between one pair of bolt holes 50 aligned in the Y-axis direction and the remaining pair of bolt holes 50. A cylindrical upper holder 54 is firmly fitted to the upper end portion of each insertion hole 52, extending out from the upper surface of the main body block 20. On the other side, a cylindrical lower holder 56 is firmly fitted to the lower end portion of each insertion hole 52, extending out from the lower surface of the main body block 20.

A rod-shaped conductor 58 is inserted into the cylindrical upper holder 54, and is firmly held by the upper holder 54. The upper end of the conductor 58 extends out from the upper end of the upper holder 54, and the lower end of the conductor 58 is inserted into the insertion hole 52, and extends out from the cylindrical lower holder 56. A rod-shaped electrode 22 is coaxially fixed to the conductor 58 at the lower end of the conductor 58, and the electrode 22 extends out downward from the lower end of the lower holder 56.

A small-diameter segment 60 having a small diameter is vertically formed at the center of the insertion hole 52, and the inner diameter of the small-diameter segment 60 is substantially the same as the outer diameter of the conductor 58. The upper portion of the insertion hole 52 is sealed by the conductor 58 in the small-diameter segment 60, and a clearance exists between the inner peripheral surface of the insertion hole 52 and the outer peripheral surface of the conductor 58 in a segment below the small-diameter segment 60 of the insertion hole 52. The outer diameter of the conductor 58 and the outer diameter of the electrode 22 are smaller than the inner diameter of the lower holder 56. Therefore, clearance also exists between the inner peripheral surface of the lower holder 56 and the outer peripheral surfaces of the conductor 58 and the electrode 22.

Further, the main body block 20 has two first gas flow paths 62 that extend in the X direction (only one of the first gas flow paths is shown in FIGS. 1 and 4). One end of one of the two first gas flow paths 62 has an aperture at one of a pair of side surfaces which are opposite to each other in the X direction of the main body block 20, and the other end has an aperture in the lower side of the small-diameter segment 60 of one of the two insertion holes 52. One end of the other of the two first gas flow paths 62 has an aperture at the other side of the pair of side surfaces which are opposed to each other in the X direction of the main body block 20, and the other end has an aperture in the lower side of the small-diameter segment 60 of the other insertion hole of the two insertion holes 52.

Further, a second gas flow path 66 penetrates the main body block 20 in the vertical direction and has an aperture at the upper and lower surfaces at a position offset from the approximate center in the Y-axis direction. The main body block 20 has a connecting groove 68 on the lower surface that extends in the Y direction from the aperture of the second gas flow path 66 to the approximate center of the lower surface of the main body block 20.

Figure 6:
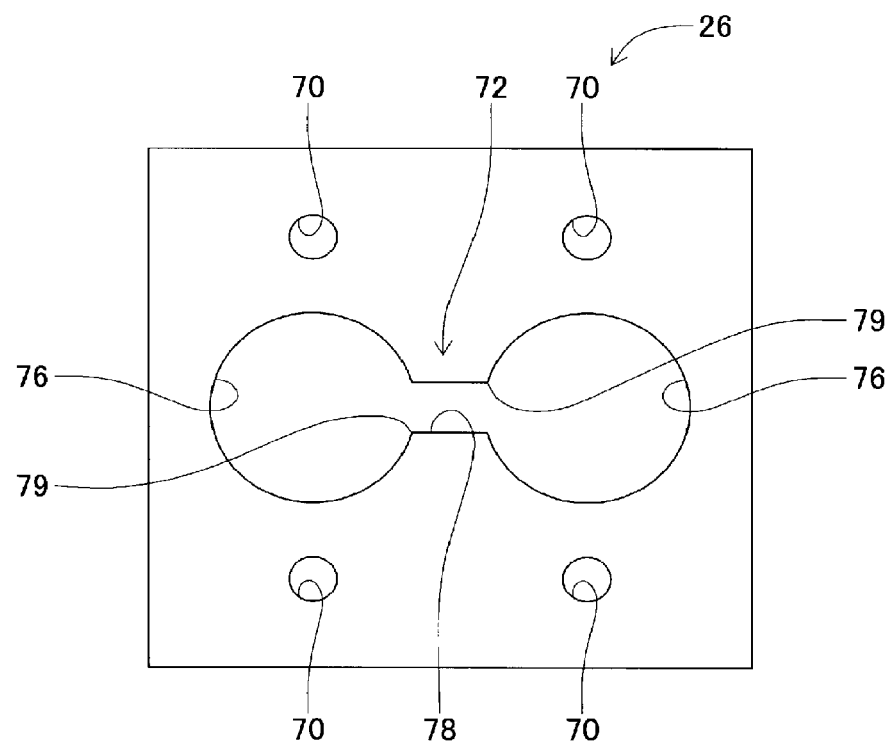
FIG. 6 is a plan view of a buffer member.
Figure 6:
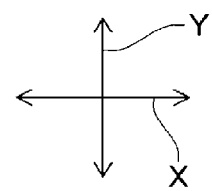

The buffer member 26 is substantially plate-shaped and is made of silicon resin. As shown in FIG. 6, the buffer member 26 has four bolt holes 70 in the thickness direction approximately at the four corners of the buffer member 26. FIG. 6 is a plan view showing the buffer member 26 as viewed from above. The thread pitch of the four bolt holes 70 is the same as the thread pitch of the four bolt holes 50 of the main body block 20.

Further, the buffer member 26 is formed with a cut-out portion 72 which is cut out in substantially dumbbell shape. The cut-out portion 72 penetrates the buffer member 26 in the thickness direction, and is divided into a pair of insertion portions 76 and a connecting segment 78. The insertion portions 76 are cut out in a substantially circular shape, and the inner diameter of the insertion portions 76 is substantially the same as the outer diameter of the lower holder 56. The pair of insertion portions 76 are aligned with each other in the X direction but spaced apart from each other. The connecting segment 78 is cut out in a substantially rectangular shape, and connects the pair of insertion portions 76. The connecting segment 78 is narrower in width than the insertion portions 76, and the length of the connecting segment 78 in the Y direction is about 4 of the inner diameter of the insertion portions 76. Incidentally, the junctures of each insertion portion 76 with the connecting segment 78, not being smoothly continuous, are corners 79. The corners 79 are lines and not surfaces formed by joining each insertion portion 76 with the connecting segment 78.

As shown in FIG. 4, the buffer member 26 having such a shape is stacked onto the lower surface of the main body block 20 so that the four bolt holes 70 overlap the four bolt holes 50 of the main body block 20. The two lower holders 56 of the main body block 20 are inserted into the pair of insertion portions 76 of the buffer member 26 stacked onto the lower surface of the main body block 20 and extend to the lower surface side of the buffer member 26. Further, as shown in FIG. 5, the connecting segment 78 of the buffer member 26 stacked onto the lower surface of the main body block 20 communicates with the connecting groove 68 of the main body block 20.

Figure 7:
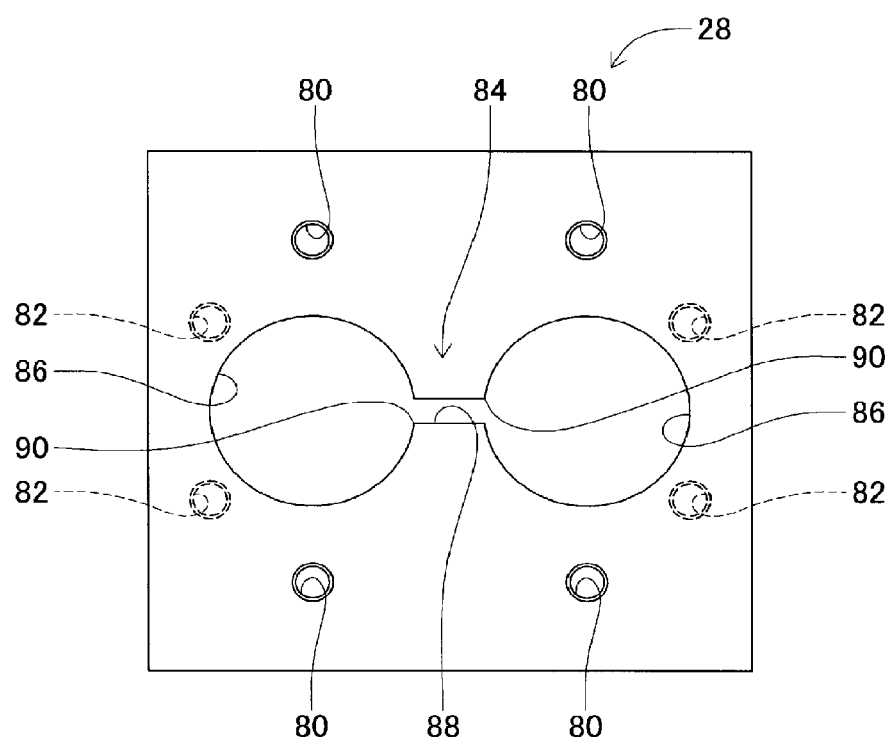
FIG. 7 is a plan view of a first connecting block.
Figure 7:
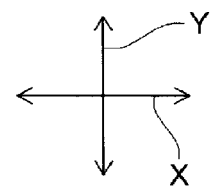

The first connecting block 28 has a substantially thick plate shape and is made of a ceramic material. The thickness of the first connecting block 28 is approximately on the order of 10 mm. As shown in FIG. 7, four screw holes 80 extend through the first connecting block 28 in the vertical direction, and apertures of the four screw holes 80 are disposed approximately at the four corners of the upper surface. FIG. 7 is a plan view showing the first connecting block 28 as viewed from above. The thread pitch of the four screw holes 80 is the same as the thread pitch of the four bolt holes 70 of the buffer member 26. Further, four screw holes 82 extend through the first connecting block 28 in the vertical direction, and apertures of the four screw holes 82 are disposed approximately at the four corners of the lower surface at positions different from the four screw holes 80.

The first connecting block 28 has a cut-out portion 84 cut out in a substantially dumbbell shape. The cut-out portion 84 penetrates the first connecting block 28 in the thickness direction, and is divided into a pair of insertion portions 86 and a connecting segment 88. The insertion portions 86 are cut out in a substantially cylindrical shape, and the inner diameter of the insertion portions 86 is substantially the same as the outer diameter of the lower holder 56. Note that the pair of insertion portions 86 are aligned with each other in the X direction but spaced apart from each other. The connecting segment 88 is cut out in a substantially rectangular shape, and connects the pair of insertion portions 86. The connecting segment 88 is narrower in width than the insertion portions 86, and the length of the connecting segment 88 in the Y direction is about ⅛ of the inner diameter of the insertion portions 86. Incidentally, the junctures of each insertion portion 86 with the connecting segment 88, not being smoothly continuous, are corners 90.

As shown in FIG. 4, the first connecting block 28 having such a shape is stacked onto the lower surface of the buffer member 26 such that the four screw holes 80 overlap the four bolt holes 70 of the buffer member 26. Bolts (not shown) are then inserted into each of the bolt holes 50 from the upper surface of the main body block 20, passed through the bolt holes 70 of the buffer member 26, and fastened to the screw holes 80 of the first connecting block 28. Thus, the main body block 20, the buffer member 26, and the first connecting block 28 are integrated.

Further, two lower holders 56 of the main body block 20 are inserted into the pair of insertion portions 86 of the first connecting block 28 stacked onto the lower surface of the buffer member 26, and the lower ends of the lower holders 56 and the lower ends of the first connecting block 28 substantially coincide with each other in the vertical direction. However, each electrode 22 inserted into the lower holder 56 extends to the lower surface side of the first connecting block 28. Further, as shown in FIG. 5, the connecting segment 88 of the first connecting block 28 stacked onto the lower surface of the buffer member 26 communicates with the connecting segment 78 of the buffer member 26.

Figure 8:
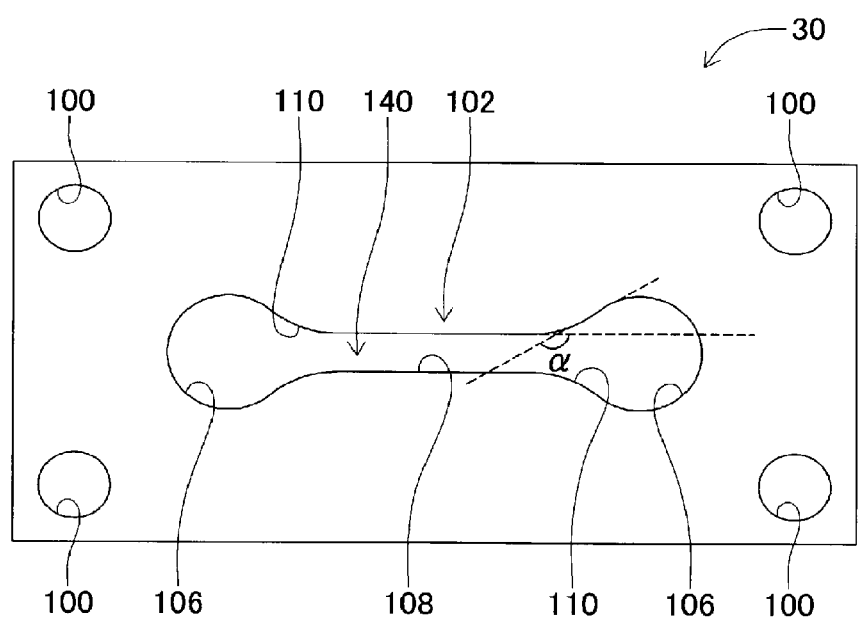
FIG. 8 is a plan view of a reaction chamber block.

The reaction chamber block 30 has a substantially thick plate shape and is made of a ceramic material. The thickness of the reaction chamber block 30 is approximately on the order of 10 mm. As shown in FIG. 8, four bolt holes 100 penetrate the reaction chamber block 30 in the vertical direction, and apertures of the four bolt holes 100 are disposed approximately at the four corners of the upper surface and the lower surface. FIG. 8 is a plan view showing the reaction chamber block 30 as viewed from above. The thread pitch of the four bolt holes 100 is the same as the thread pitch of the four screw holes 82 of the first connecting block 28.

Further, the reaction chamber block 30 has a cut-out portion 102 cutout in a substantially dumbbell shape. The cut-out portion 102 penetrates the reaction chamber block 30 in the thickness direction, and is divided into a pair of insertion portions 106 and a connecting segment 108. The insertion portions 106 are cut out in a substantially cylindrical shape, and the inner diameter of the insertion portions 106 is smaller than the outer diameter of the lower holders 56 but larger than the outer diameter of the electrodes 22. Note that the pair of insertion portions 106 are aligned with each other in the X direction but spaced apart from each other. The connecting segment 108 is cut out in a substantially rectangular shape, and connects the pair of insertion portions 106. The connecting segment 108 is narrower in width than the insertion portions 106, and the length of the connecting segment 108 in the Y direction is about 4 of the inner diameter of the insertion portions 106. The length of the connecting segment 108 in the Y direction is made shorter than the outer diameter of the electrodes 22.

Incidentally, the junctures of each insertion portion 106 with the connecting segment 108 are smooth surfaces 110. That is, there are no corners and no pointed portions at the junctures of each insertion portion 106 with the connecting segment 108. More specifically, each insertion portion 106 is curved with a curvature R (=1/r) corresponding to the inner diameter r of the insertion portion at a position away from the connecting segment 103, but the curvature R (<1/r) becomes smaller as the insertion portion 106 approaches the connecting segment 108. Each insertion portion 106 and the connecting segment 108 are connected to each other with a small curvature R (<1/r). Therefore, the curvature of the smooth surfaces 110 connecting each insertion portion 106 and the connecting segment 108 is 1/r or less. However, although the curvature R of the smooth surfaces in the present disclosure may be larger than 1/r, it is preferable that the curvature R of the smooth surfaces in the present disclosure is 1/(0.1r to 0.5r) or less, which would exclude simple chamfering. In order to ensure smoothness at the junctures of each insertion portion 106 with the connecting segment 108, it is preferable that the angle α formed by the inner wall surface of each insertion portion 106 and the inner wall surface of the connecting segment 108 is, at minimum, 110 to 130 degrees or more.

The reaction chamber block 30, having such a shape, is stacked onto the lower surface of the first connecting block 28 so that the four bolt holes 100 overlap the four screw holes 82 of the first connecting block 28. As shown in FIG. 4, the electrodes 22 extending from the lower surface of the first connecting block 28 are inserted through the pair of insertion portions 106 of the reaction chamber block 30 stacked onto the lower surface of the first connecting block 28. Further, as shown in FIG. 5, the connecting segment 108 of the reaction chamber block 30 stacked onto the lower surface of the first connecting block 28 communicates with the connecting segment 88 of the first connecting block 28.

Figure 9:
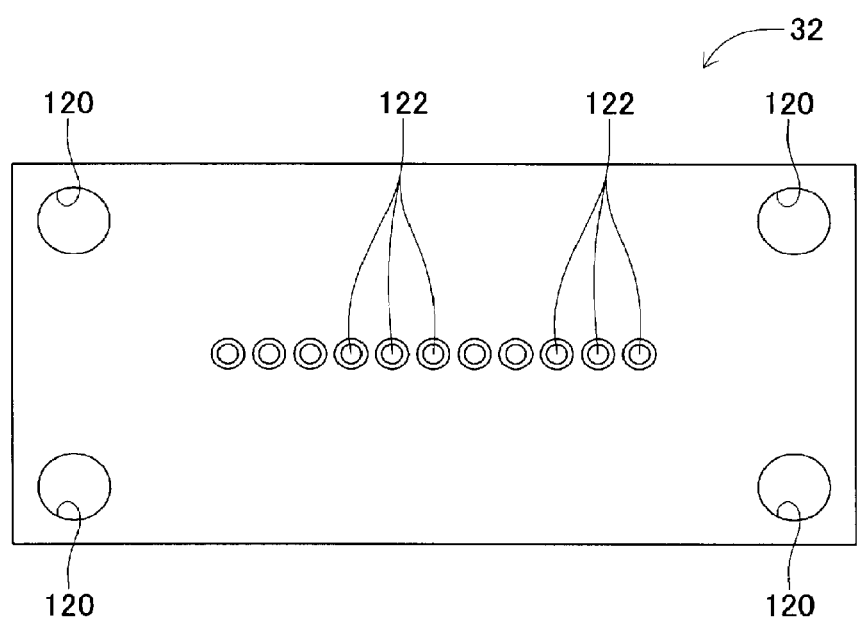
FIG. 9 is a plan view of a second connecting block.
Figure 9:
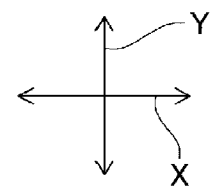

The second connecting block 32 has a substantially thick plate shape and is made of a ceramic material. The thickness of the second connecting block 32 is approximately on the order of 5 mm. As shown in FIG. 9, four bolt holes 120 penetrate the second connecting block 32 in the vertical direction, and apertures of the four bolt holes 120 are disposed approximately at the four corners of the upper surface and the lower surface of the second connecting block 32. FIG. 9 is a plan view showing the second connecting block 32 as viewed from above. The thread pitch of the four bolt holes 120 is the same as the thread pitch of the four bolt holes 100 of the reaction chamber block 30.

Further, a plurality of communication holes 122 penetrate the second connecting block. 32 in the vertical direction. The plurality of communication holes 122 are aligned in the X direction at the center portion in the Y direction. The inner diameter of each communication hole 122 is about 0.5 to 1 mm, and is chamfered at the upper edge and the lower edge.

The second connecting block 32 having such a shape is stacked onto the lower surface of the reaction chamber block 30 so that the four bolt holes 120 overlap the four bolt holes 100 of the reaction chamber block 30. As shown in FIGS. 4 and 5, the plurality of communication holes 122 of the second connecting block 32 stacked onto the lower surface of the reaction chamber block 30 communicate with the pair of insertion portions 106 and the connecting segment 108 of the reaction chamber block 30.

Figure 10:
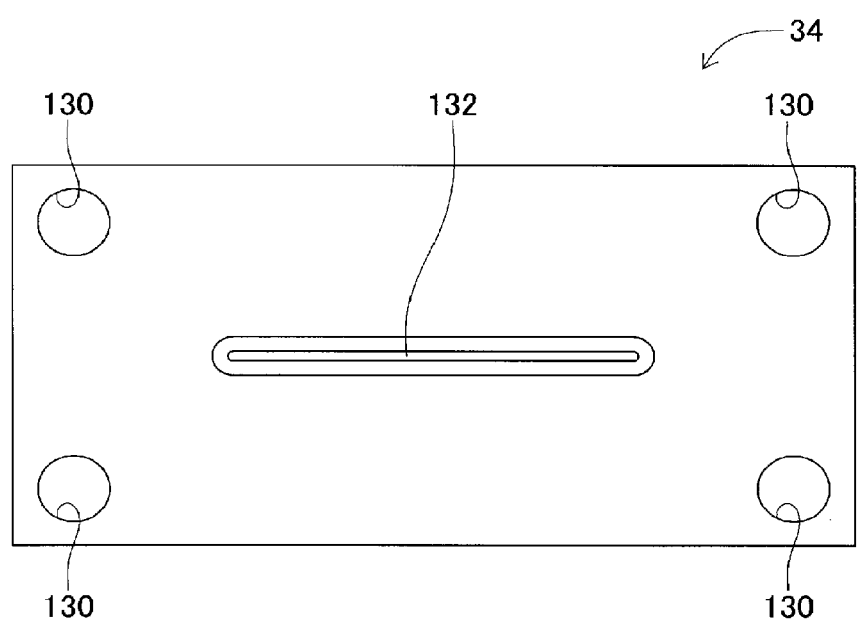
FIG. 10 is a plan view of a nozzle block.

The nozzle block 34 is substantially plate-shaped and is made of a ceramic material. As shown in FIG. 10, four bolt holes 130 penetrate the nozzle block 34 in the vertical direction, and apertures of the four bolt holes 130 are disposed approximately at the four corners of the upper surface and the lower surface. FIG. 10 is a plan view showing the nozzle block 34 as viewed from above. The thread pitch of the four bolt holes 130 is the same as the thread pitch of the four bolt holes 120 of the second connecting block 32.

Further, a slit-shaped nozzle hole 132 penetrates the nozzle block 34 in the vertical direction. The nozzle hole 132 extends in the X direction at the center portion in the Y direction. The width of the nozzle hole 132 in the Y direction is about 0.5 mm, and the length of the nozzle hole 132 in the X direction is substantially the same as the length of the plurality of communication holes 122 of the second connecting block 32 from one end to the other end in the X direction. The upper edge of the nozzle hole 132 is chamfered.

The nozzle block 34 having such a shape is stacked onto the lower surface of the second connecting block 32 so that the four bolt holes 130 overlap the four bolt holes 120 of the second connecting block 32. Bolts (not shown) are then inserted into each of the bolt holes 130 from the lower surface of the nozzle block 34, passed through the bolt holes 120 of the second connecting block 32 and the bolt holes 100 of the reaction chamber block 30, and fastened to the screw holes 82 of the first connecting block 28. Thus, the first connecting block 28, the reaction chamber block 30, the second connecting block 32, and the nozzle block 34 are integrated.

As shown in FIGS. 4 and 5, the nozzle hole 132 of the nozzle block 34 stacked onto the lower surface of the second connecting block 32 communicate with the plurality of communication holes 122 of the second connecting block 32. When the first connecting block 28, the reaction chamber block 30, the second connecting block 32, and the nozzle block 34 are integrated, the distance between the lower end surface of the electrodes 22 inserted into the insertion portions 106 of the reaction chamber block 30 and the upper surface of the second connecting block 32 is about 2 to 3 mm.

<Plasma Irradiation by Atmospheric Pressure Plasma Generator>

The atmospheric pressure plasma generator 10 is an apparatus for irradiating a liquid with plasma, in which a process gas is converted to plasma in a reaction chamber 140 defined by the cut-out portion 102 of the reaction chamber block 30, the lower surface of the first connecting block 28, and the upper surface of the second connecting block 32, and the plasma is irradiated from the nozzle hole 132 of the nozzle block 34. Hereinafter, plasma irradiation by the atmospheric pressure plasma generator 10 will be described in detail.

In the atmospheric pressure plasma generator 10, an inert gas such as nitrogen is supplied as a process gas to the first gas flow paths 62 that has an aperture at the side surfaces of the main body block 20. The inert gas supplied to the first gas flow paths 62 flows into the insertion hole 52, and is supplied to the insertion portions 106 of the reaction chamber block 30, that is, the reaction chamber 140, through spaces between the lower holders 56 and the conductors 58 and spaces between the lower holders 56 and the electrodes 22. Further, a reactive gas containing oxygen or the like is supplied as a process gas to the second gas flow path 66 that has an aperture at the upper surface of the main body block 20. The reactive gas supplied to the second gas flow path 66 is supplied to the connecting segment 108 of the reaction chamber block 30, that is, the reaction chamber 140, via the connecting groove 68, the connecting segment 78, and the connecting segment 88. The feed rate of the inert gas to the first gas flow paths 62 and the feed rate of the reactive gas to the second gas flow path 66 are about 2 L/min.

In the reaction chamber 140, a voltage is applied to the pair of electrodes 22, and current flows between the pair of electrodes 22. As a result, a pseudo arc discharge is generated between the pair of electrodes 22 and the process gas is converted into plasma by the discharge. Pseudo arc discharging is a method of discharging a plasma power supply while limiting current so that a large current does not flow as in normal arc discharging. In this case, since pseudo-arc discharging occurs mainly at the connecting segment 108 of the reaction chamber 140, the process gas is efficiently converted into plasma. Specifically, as described above, the length of the connecting segment 108 in the Y direction is made shorter than the outer diameter of the electrodes 22. The pair of electrodes 22 are inserted into the pair of insertion portions 106 that are continuous with the ends of the connecting segment 108. As a result, pseudo arc discharging occurs over the entire area of the connecting segment 108 and along the wall surface that is continuous from each insertion portion 106 to the connecting segment 108. Since the connecting segment 108 is narrower than the insertion portion 106, the volume of the connecting segment 108 is small. Therefore, the process gas having a small volume is converted to plasma over the entire region of the connecting segment 108 and along the wall surface that is continuous from each insertion portion 106 to the connecting segment 108 so that the process gas is converted to plasma efficiently. More specifically, each electrode 22 extends to a location near the bottom of the reaction chamber 140, that is, a location near the communication holes 122 of the second connecting block 32 through which the plasma is discharged from the reaction chamber 140, and is discharged from that location. In this way, the gas can be discharged from the reaction chamber 140 without lowering the activity of radicals contained in the plasma-converted gas.

The plasma generated in the reaction chamber 140 flows into the plurality of communication holes 122 of the second connecting block 32. The plasma is then ejected from the nozzle hole 132 of the nozzle block 34, and the liquid to be processed is exposed to the plasma. In a general atmospheric pressure plasma generator, the feed rate of the process gas is 30 L/min, but in the atmospheric pressure plasma generator 10 of the present disclosure, the feed rate of the process gas, that is, the feed rate of the inert gas in the first gas flow paths 62 and the feed rate of the reactive gas in the second gas flow path 66 are about 2 L/min. As a result, in the atmospheric pressure plasma generator 10, the air flow of the plasma ejected from the nozzle hole 132 is suppressed making it possible to suppress ripples (i.e., the generation of ripples) of the liquid exposed to the plasma. Further, in the atmospheric pressure plasma generator 10, the nozzle hole 132 through which plasma is ejected has a slit shape. In this way, plasma is widely irradiated from the nozzle hole 132 and turbulence of the air flow is suppressed, thereby further suppressing ripples of the liquid exposed to the plasma.

Figure 11:
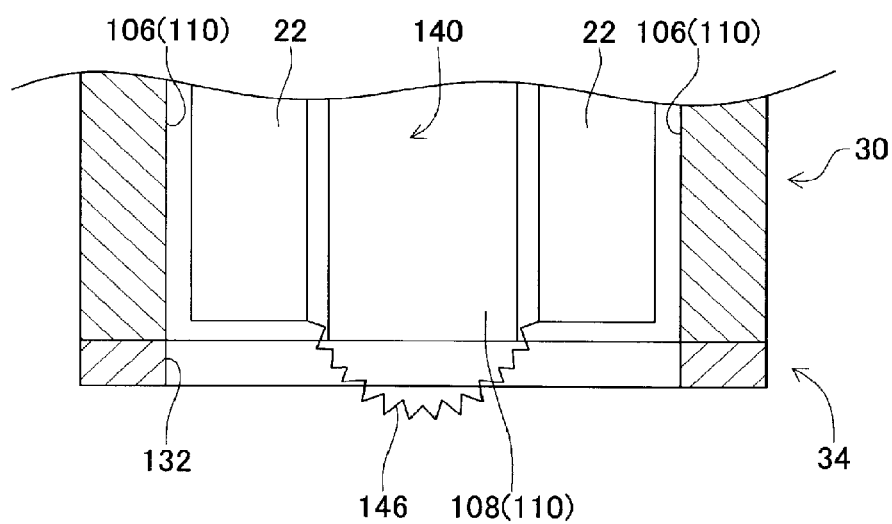
FIG. 11 is a cross-sectional view showing a state in which the nozzle block is stacked onto the lower surface of the reaction chamber block.

As described above, in the atmospheric pressure plasma generator 10, since the plasma is ejected from the slit-shaped nozzle hole 132, the second connecting block 32 prevents the pseudo arc discharge from being ejected. Specifically, for example, as shown in FIG. 11, in the atmospheric pressure plasma generator 10 in which the nozzle block 34 is stacked onto the lower surface of the reaction chamber block 30, when a voltage is applied to the pair of electrodes 22, the pseudo arc discharge 146 generated between the pair of electrodes 22 may come out of the reaction chamber 140 and reach the inside of the nozzle hole 132 and the lower end surface of the nozzle block 34. In other words, the pseudo arc discharge 146 may come out of the atmospheric pressure plasma generator.

As described above, when the pseudo arc discharge 146 is generated outside the reaction chamber 140, particularly outside the atmospheric pressure plasma generator 10, high energy is dispersed, and the process gas cannot be properly converted to plasma. Further, since the concentration of the process gas is low outside the reaction chamber 140, the process gas cannot be adequately converted to plasma. In other words, even if the process gas is converted into plasma by the pseudo arc discharge 146 outside the reaction chamber 140, the radicals included in the plasma react with oxygen to become ozone, and the effect of plasma irradiation is reduced.

In view of this, in the atmospheric pressure plasma generator 10, the second connecting block 32 is disposed between the reaction chamber block 30 and the nozzle block 34, and the second connecting block 32 has the plurality of communication holes 122. Therefore, the pseudo arc discharge 146 generated by the electrodes 22 is prevented from coming out of the reaction chamber 140 by the presence of walls between the communication holes 122. In particular, since the inner diameter of the communication holes 122 is small (i.e., about 0.5 to 1 mm), the pseudo arc discharge 146 is adequately prevented from coming out of the reaction chamber 140. As a result, the pseudo arc discharge 146 is generated inside the reaction chamber 140, and the process gas can be efficiently converted to plasma.

Further, in the atmospheric pressure plasma generator 10, as described above, the connecting segment 108 of the reaction chamber 140 is narrow, and the discharge is generated along the entire area of the connecting segment 108 and the wall surface that is continuous from each insertion portion 106 to the connecting segment 108, thereby allowing the process gas to be efficiently converted to plasma. In this case, the wall surface of the reaction chamber 140 of the reaction chamber block 30 made of ceramic may become carbonized. In particular, for example, when a corner is present on a wall surface continuous from the insertion portions 106 to the connecting segment 108, heat due to discharging may concentrate at the corner and cause the corner to become considerably carbonized.

Figure 12:
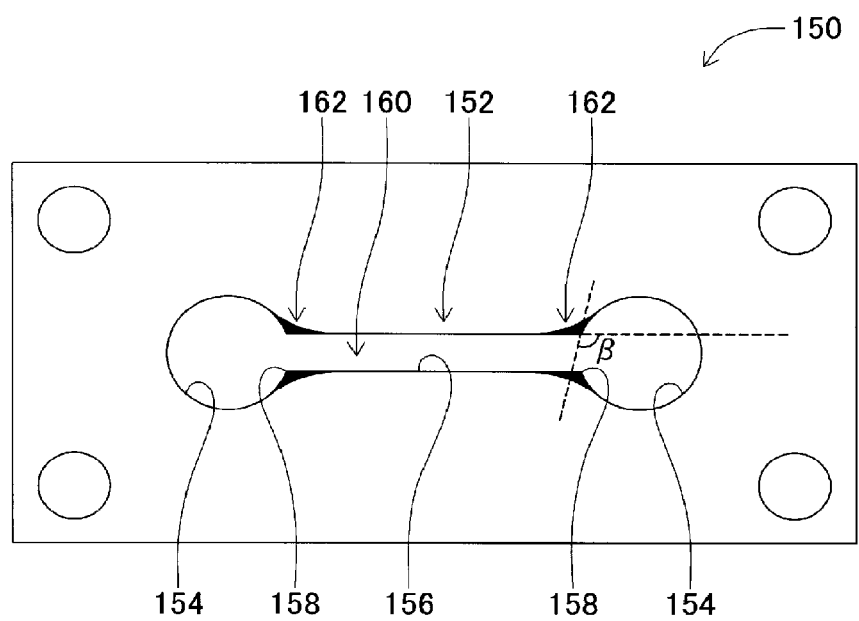
FIG. 12 is a plan view of a reaction chamber block of a comparative example.
Figure 12:
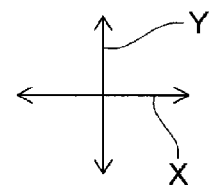

Specifically, for example, a reaction chamber block 150 shown in FIG. 12 has a cut-out portion 152 having substantially the same shape as the cut-out portion 102 of the reaction chamber block 30. The cut-out portion 152 in the reaction chamber block 150 is divided into a pair of insertion portions 154 and a connecting segment 156 in the same manner as the cut-out portion 102 of the reaction chamber block 30 but the junctures of each insertion portion 154 with the connecting segment 156 are different from the cut-out portion 102 of the reaction chamber block 30 in that the junctures are not smoothly continuous and are corners 158. Since each insertion portion 154 and the connecting segment 156 are connected via the corner 158, the angle β formed by the inner wall surface of the insertion portion 154 and the inner wall surface of the connecting segment 156 is, at minimum, about 90 to 100 degrees.

When the pair of electrodes 22 are inserted into the pair of insertion portions 154 in the cut-out portion 152 having such a shape (i.e., in the reaction chamber 160) and a voltage is applied to the pair of electrodes 22, discharging occurs along the wall surface that is continuous from each insertion portion 154 to the connecting segment 156. In this case, heat due to discharging concentrates at the corners 158, and the corners 158 become carbonized. Reference numeral 162 in the figure indicates a carbonized portion. As described above, when the corners 158 are carbonized, the carbonized portions become carbonized conductive paths such that adequate discharging may not occur. Consequently, it may become necessary to replace the reaction chamber block 150 despite a possible increase in running cost.

In view of this, as shown in FIG. 8, the junctures of each insertion portion 106 with the connecting segment 108 in the cut-out portion 102 of the reaction chamber block 30 are smooth surfaces 110 in the atmospheric pressure plasma generator 10. Therefore, heat due to discharging is dispersed throughout the smooth surface 110, and carbonization due to discharging is suppressed. As a result, the durability of the reaction chamber block 30 is improved, and the running cost is decreased.

Since no discharging occurs in the buffer member 26 and the first connecting block 28, the junctures of each insertion portion 76 with the connecting segment 78 are corners 79, and the junctures of each insertion portion 86 and the connecting segment 88 are also corners 90. That is, since it is not necessary to consider carbonization from discharging in the buffer member 26 and the first connecting block 28, the junctures of each insertion portion 76 with the connecting segment 78 and the junctures of each insertion portion 86 with the connecting segment 88 are not smooth. In this way, the cost of manufacturing the buffer member 26 and the first connecting block 28 is decreased.

Further, by supplying the reactive gas containing oxygen as the process gas to the connecting segment 108 of the reaction chamber 140, a plasma containing radicals is suitably generated. On the other hand, an inert gas containing no oxygen is supplied as the process gas to the insertion portions 106 of the reaction chamber 140. Therefore, since the electrodes 22 are covered with the inert gas, oxidation of the electrodes 22 is prevented, and durability of the electrodes 22 is improved.

Incidentally, in the above embodiment, the atmospheric pressure plasma generator 10 is an example of a plasma generator. The electrodes 22 are examples of electrodes. The first connecting block 28 is an example of a second block. The reaction chamber block 30 is an example of a first block. The second connecting block 32 is an example of a plate-like member. The nozzle block 34 is an example of a nozzle. The insertion portions 86 are examples of second insertion portions. The connecting segment 88 is an example of a second connecting segment. The corner 90 is an example of a corner. The insertion portions 106 are examples of first insertion portions. The connecting segment 108 is an example of a first connecting segment. The smooth surface 110 is an example of a smooth surface. The communication holes 122 are examples of communication holes. The nozzle hole 132 is an example of a nozzle port. The reaction chamber 140 is an example of a reaction chamber.

It should be noted that the present disclosure is not limited to the above embodiment and can be implemented in various modes in which various modifications and improvements are made based on the knowledge of a person skilled in the art. Specifically, for example, in the above embodiment, the object to be treated in the atmospheric pressure plasma generator 10 is a liquid, but various objects other than liquids can be treated with the plasma. When the object to be treated is an electronic component or the like, it is preferable to dispose a ground plate between the second connecting block 32 and the nozzle block 34.

In the above embodiment, the thickness of the second connecting block 32 is about 5 mm, but it may be any thickness. However, if the second connecting block 32 is too thin, protrusion of the pseudo arc discharge 146 may not be adequately prevented. On the other hand, if the second connecting block 32 is too thick, radicals contained in the plasma may become deactivated. Therefore, the thickness of the second connecting block 32 is preferably about 2 to 20 mm.

In the above embodiment, the process gas is supplied to the reaction chamber 140 through a plurality of paths, specifically, the pair of the first gas flow paths 62 and the second gas flow path 66, but the process gas can be supplied to the reaction chamber 140 through just one path.

Although the present disclosure is applied to an atmospheric pressure plasma generator 10 in the above embodiment, the present disclosure can be applied to a plasma generator that generates plasma under reduced pressure. Further, in the above embodiment, pseudo arc discharging is employed as the plasma discharging method, but it is possible to employ normal arc discharging, that is, a discharging method that discharges by passing a large current. Note that arc discharging is a method of discharging that emits electrons from a cathode and is characterized by a temperature that is high due to a large current. For this reason, they are used for welding, melting furnaces, and the like. It is also possible to employ a hollow cathode discharge. A hollow cathode discharge is a discharge using a cylindrical (i.e., hollow) cathode, and when a cathode has a cylindrical hollow shape, electrons can be easily trapped and a high-density plasma can be generated. Further, it is also possible to employ a dielectric barrier discharge. In a dielectric barrier discharge, a dielectric material, such as glass or ceramic, is placed between a pair of electrodes to prevent electrons from flying between the electrodes as in an arc discharge. When a high-frequency voltage is applied between the electrodes and the voltage between the electrodes becomes equal to or higher than the discharge breakdown voltage of the gas, a discharge occurs. However, since a barrier is formed between the electrodes by the dielectric material, the discharge is immediately terminated. Therefore, by increasing the number of discharges by the high-frequency voltage, the density of plasma can be increased. Further, since electrons are not emitted from the electrode as in the case of an arc discharge, there is no damage to the electrode.

REFERENCE SIGNS LIST

10: Atmospheric pressure plasma generator (plasma generator) 22: electrodes 28: first connecting block (second block) 30: reaction chamber block (first block) 32: second connecting block (plate-like member) 34: nozzle block (nozzle) 86: insertion portion (second insertion portion) 88: connecting segment (second connecting segment) 90: corner (corner) 106: insertion portion (first insertion portion) 108: connecting segment (first connecting segment) 110: smooth surface 122: communication hole (connecting hole) 132: nozzle hole (nozzle port) 140: reaction chamber 16

The invention claimed is:

1. A plasma generator, comprising:
   a reaction chamber block including a reaction chamber divided into a pair of first insertion portions, for inserting a pair of electrodes into the reaction chamber for converting a process gas into plasma in the reaction chamber, a first connecting segment narrower than the pair of first insertion portions, and first junctures of each of the pair of first insertion portions with the first connecting segment are smooth surfaces;
   a connecting block including pair of second insertion portions communicating with the pair of first insertion portions and into which the pair of electrodes are inserted, a second connecting segment that, in addition to connecting the pair of second insertion portions, is narrower than the pair of second insertion portions, and junctures of each of the pair of second insertion portions with the second connecting segment are corners; and
   a nozzle for ejecting the gas, converted to plasma in the reaction chamber, toward a process target.

2. The plasma generator according to claim 1, wherein the nozzle has a slit-shaped nozzle port, and the plasma generator includes a plate-like member, being disposed between the block and the nozzle, having a plurality of communication holes that enable communication between the reaction chamber and the nozzle port.

3. The plasma generator according to claim 1, wherein a reactive gas is supplied as the process gas to the first connecting segment of the reaction chamber through the second connecting segment, and
   an inert gas is supplied as the process gas to the first insertion portions of the reaction chamber through the second insertion portions.

* * * * *